(12) United States Patent
Yoshida

(10) Patent No.: US 11,501,984 B2
(45) Date of Patent: Nov. 15, 2022

(54) SUBSTRATE PROCESSING DEVICE AND SUBSTRATE PROCESSING METHOD

(71) Applicant: SCREEN Holdings Co., Ltd., Kyoto (JP)

(72) Inventor: Yukifumi Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 201 days.

(21) Appl. No.: 16/638,307

(22) PCT Filed: Jun. 15, 2018

(86) PCT No.: PCT/JP2018/022982
§ 371 (c)(1),
(2) Date: Feb. 11, 2020

(87) PCT Pub. No.: WO2019/058667
PCT Pub. Date: Mar. 28, 2019

(65) Prior Publication Data
US 2020/0227288 A1 Jul. 16, 2020

(30) Foreign Application Priority Data
Sep. 19, 2017 (JP) .............................. JP2017-178852

(51) Int. Cl.
*H01L 21/67* (2006.01)
*B08B 3/08* (2006.01)
(Continued)

(52) U.S. Cl.
CPC .......... *H01L 21/67051* (2013.01); *B08B 3/08* (2013.01); *C11D 3/042* (2013.01);
(Continued)

(58) Field of Classification Search
CPC ......... H01L 21/67051; H01L 21/02057; H01L 21/68764; H01L 21/02041; B08B 3/08;
(Continued)

(56) References Cited

U.S. PATENT DOCUMENTS

2006/0151008 A1 7/2006 Takushima ...................... 134/34
2008/0271752 A1 11/2008 Takushima ........................ 134/2
(Continued)

FOREIGN PATENT DOCUMENTS

| JP | 05-036661 A | 2/1993 |
| JP | 2012-533649 A | 12/2012 |
| WO | WO 2004/088735 A1 | 10/2004 |

OTHER PUBLICATIONS

International Preliminary Report on Patentability and Written Opinion dated Mar. 24, 2020 issued in corresponding International Patent Application No. PCT/JP2018/022982 with English translation.
(Continued)

*Primary Examiner* — Erin F Bergner
(74) *Attorney, Agent, or Firm* — Ostrolenk Faber LLP

(57) ABSTRACT

A substrate processing apparatus includes a first cleaning solution supply part for supplying a main surface of a substrate with an alkaline or acid first cleaning solution and a second cleaning solution supply part for supplying the main surface with a second cleaning solution containing a thickener and having a viscosity higher than that of the first cleaning solution. In a state where one cleaning solution out of the first cleaning solution and the second cleaning solution is present on the main surface, the other cleaning solution is supplied onto the main surface. It is thereby possible to more reliably remove unnecessary substances on the main surface of the substrate.

13 Claims, 8 Drawing Sheets

(51) Int. Cl.
    *C11D 3/04*          (2006.01)
    *C11D 11/00*        (2006.01)
    *H01L 21/02*        (2006.01)
    *H01L 21/687*      (2006.01)

(52) U.S. Cl.
    CPC .... *C11D 11/0047* (2013.01); *H01L 21/02057* (2013.01); *H01L 21/68764* (2013.01)

(58) Field of Classification Search
    CPC ....... C11D 3/042; C11D 11/0047; C11D 7/04; C11D 11/0064; C11D 17/0008; C11D 11/0023; C11D 17/08; B05B 7/00
    See application file for complete search history.

(56) References Cited

U.S. PATENT DOCUMENTS

| | | | |
|---|---|---|---|
| 2009/0050175 A1 | 2/2009 | Tanaka et al. | 134/1 |
| 2010/0016202 A1 | 1/2010 | Mui et al. | 510/175 |

OTHER PUBLICATIONS

International Search Report dated Sep. 11, 2018 in corresponding PCT International Application No. PCT/JP2018/022982.
Written Opinion dated Sep. 11, 2018 in corresponding PCT International Application No. PCT/JP2018/022982.
Makoto Yamauchi et al., "PTV Measurement at Close Region to Interface of a Water Drop in Oil," The Japanese Society for Multiphase Flow, vol. 14, Issue 4, pp. 466-472, 2000 (with English abstract).

SUBSTRATE PROCESSING DEVICE AND SUBSTRATE PROCESSING METHOD

CROSS-REFERENCE TO RELATED APPLICATIONS

The present application is a 35 U.S.C. §§ 371 national phase conversion of International Application No. PCT/JP2018/022982, filed Jun. 15, 2018, which claims priority to Japanese Patent Application No. 2017-178852, filed Sep. 19, 2017, the contents of both of which are incorporated herein by reference. The PCT International Application was published in the Japanese language.

TECHNICAL FIELD

The present invention relates to a substrate processing apparatus and a substrate processing method.

BACKGROUND ART

In a process of manufacturing a semiconductor substrate (hereinafter, referred to simply as a "substrate"), conventionally, a cleaning process is performed on a surface of the substrate. Japanese Patent Application Laid-Open No. 2012-533649, for example, discloses a cleaner for removing contaminants from a substrate surface. The cleaner contains a solvent and a polymer consisting of one or more polymer compounds, and the polymer includes a long polymer chain which captures the contaminants from the surface of the substrate and takes them therein. Further, the viscosity of the cleaner ranges from about 10 cP to about 100000 cP.

Furthermore, the document titled "PTV Measurement at Close Region to Interface of a Water Drop in Oil" by Makoto YAMAUCHI and two others (Japanese Journal of Multiphase Flow, The Japanese Society of Multiphase Flow, 2000, Vol. 14, No. 4, p.p. 466-472) shows that by photographing, with a camera, a state where a glass thin-walled tube is filled with silicone oil and a water droplet of ion exchange water containing tracer particles falls down in the silicone oil, it is confirmed that a spiral flow occurs inside the water droplet.

Even in the case where a cleaning solution is used, sometimes unnecessary substances (particles or the like) on a main surface of a substrate cannot be appropriately removed. Therefore, required is a new method for more reliably removing unnecessary substances on a main surface of a substrate by using a cleaning solution.

SUMMARY OF INVENTION

The present invention is intended for a substrate processing apparatus, and it is an object of the present invention to provide a new technique for more reliably removing unnecessary substances on a main surface of a substrate.

The substrate processing apparatus according to the present invention includes a first cleaning solution supply part for supplying a main surface of a substrate with an alkaline or acid first cleaning solution and a second cleaning solution supply part for supplying the main surface with a second cleaning solution containing a thickener and having a viscosity higher than that of the first cleaning solution, and in the apparatus, in a state where one cleaning solution out of the first cleaning solution and the second cleaning solution is present on the main surface, the other cleaning solution is supplied onto the main surface.

According to the present invention, it is possible to more reliably remove unnecessary substances on the main surface of the substrate.

In one preferred embodiment of the present invention, the substrate processing apparatus further includes a rinse liquid supply part for supplying the main surface with a rinse liquid after the first cleaning solution and the second cleaning solution are supplied onto the main surface.

In another preferred embodiment of the present invention, the substrate processing apparatus further includes a substrate holding part for holding the substrate in a horizontal position and a substrate rotating mechanism for rotating the substrate holding part around an axis perpendicular to the main surface as a center, and with the rotation of the substrate by the substrate rotating mechanism, an interface between the first cleaning solution and the second cleaning solution, which is formed on the main surface, moves along the main surface.

In this case, preferably, the substrate processing apparatus further includes a control part for controlling the first cleaning solution supply part and the second cleaning solution supply part, and by the control of the control part, in a state where a liquid film of the one cleaning solution is formed on the main surface, the other cleaning solution is supplied onto the main surface.

More preferably, by supplying the main surface with the other cleaning solution, the one cleaning solution is removed from the main surface and a liquid film of the other cleaning solution is formed thereon, and by the control of the control part, in a state where the liquid film of the other cleaning solution is formed on the main surface, the one cleaning solution is supplied onto the main surface.

In still another preferred embodiment of the present invention, the first cleaning solution supply part or the second cleaning solution supply part has a two-fluid nozzle for ejecting droplets of the cleaning solution.

In yet another preferred embodiment of the present invention, the first cleaning solution and the second cleaning solution are the same type of cleaning solution.

In one aspect of the present invention, a concentration of a thickener contained in the first cleaning solution is lower than that in the second cleaning solution, or the first cleaning solution contains no thickener.

In another aspect of the present invention, the second cleaning solution contains water, and the thickener in the second cleaning solution is a water-soluble polymer.

In still another aspect of the present invention, a difference between the viscosity of the first cleaning solution and that of the second cleaning solution is 500 mPa·s or more.

The present invention is also intended for a substrate processing method. The substrate processing method according to the present invention includes a) supplying a main surface of a substrate with one cleaning solution out of an alkaline or acid first cleaning solution and a second cleaning solution containing a thickener and having a viscosity higher than that of the first cleaning solution and b) supplying the main surface with the other cleaning solution in a state where the one cleaning solution is present on the main surface.

These and other objects, features, aspects and advantages of the present invention will become more apparent from the following detailed description of the present invention when taken in conjunction with the accompanying drawings.

DESCRIPTION OF EMBODIMENTS

Figure 1:
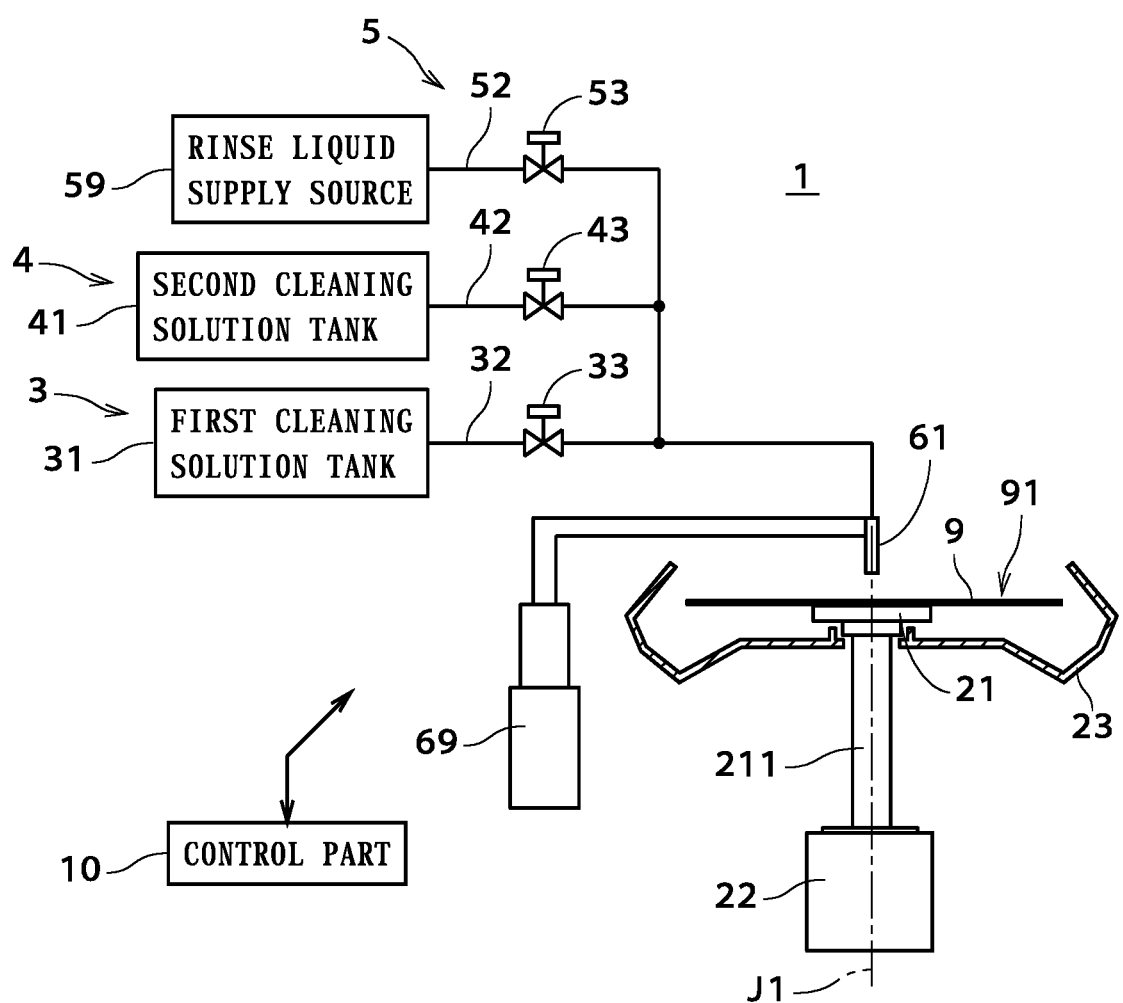
FIG. 1 is a view showing a configuration of a substrate processing apparatus in accordance with a first preferred embodiment.

FIG. 1 is a view showing a configuration of a substrate processing apparatus 1 in accordance with the first preferred embodiment of the present invention. The substrate processing apparatus 1 is an apparatus which supplies a main surface of a substrate with a cleaning solution and thereby cleans the main surface. The substrate processing apparatus 1 includes a control part 10, a spin chuck 21, a spin motor 22, and a cup 23.

The control part 10 performs a general control of the substrate processing apparatus 1. The spin chuck 21 has a plurality of not-shown suction holes in an upper surface thereof, and a main surface of a substrate 9, which faces downward, is adsorbed by the plurality of suction holes. The substrate 9 is thereby held by the spin chuck 21 in a horizontal position. In the substrate processing apparatus 1, a substrate holding part other than the spin chuck 21 may be used, and for example, a substrate holding part which grips an outer edge portion of the substrate 9 having a disk-like shape may be provided.

On a lower surface of the spin chuck 21, connected is a shaft 211 extending in an up-and-down direction (vertical direction). A central axis J1 of the shaft 211 is perpendicular to a main surface 91 of the substrate 9, which faces upward, and passes through a center of the substrate 9. The spin motor 22 is a substrate rotating mechanism and rotates the shaft 211. The spin chuck 21 and the substrate 9 are thereby rotated around the central axis J1. The cup 23 surrounds a periphery of the spin chuck 21. Further, FIG. 1 shows a cross section of the cup 23, taken along a plane including the central axis J1.

The substrate processing apparatus 1 further includes a first cleaning solution supply part 3, a second cleaning solution supply part 4, a rinse liquid supply part 5, and a nozzle moving mechanism 69. The first cleaning solution supply part 3 includes a nozzle 61, a first cleaning solution tank 31, a first cleaning solution supply pipe 32, and a first cleaning solution valve 33. The first cleaning solution tank 31 stores therein a first cleaning solution described later. The first cleaning solution supply pipe 32 connects the nozzle 61 to the first cleaning solution tank 31. The first cleaning solution valve 33 is provided on the first cleaning solution supply pipe 32. As described later, in the substrate processing apparatus 1 of FIG. 1, the first cleaning solution supply part 3, the second cleaning solution supply part 4, and the rinse liquid supply part 5 shares the nozzle 61. The second cleaning solution supply part 4 includes the nozzle 61, a second cleaning solution tank 41, a second cleaning solution supply pipe 42, and a second cleaning solution valve 43. The second cleaning solution tank 41 stores therein a second cleaning solution described later. The second cleaning solution supply pipe 42 connects the nozzle 61 to the second cleaning solution tank 41. The second cleaning solution valve 43 is provided on the second cleaning solution supply pipe 42.

The rinse liquid supply part 5 includes the nozzle 61, a rinse liquid supply source 59, a rinse liquid supply pipe 52, and a rinse liquid valve 53. The rinse liquid supply pipe 52 connects the nozzle 61 to the rinse liquid supply source 59. The rinse liquid supply source 59 is a supply source of pure water which is a rinse liquid. The rinse liquid valve 53 is provided on the rinse liquid supply pipe 52. In the substrate processing apparatus 1, the first cleaning solution supply part 3, the second cleaning solution supply part 4, and the rinse liquid supply part 5 shares the nozzle 61, and the first cleaning solution supply pipe 32, the second cleaning solution supply pipe 42, and the rinse liquid supply pipe 52 become one supply pipe in the vicinity of the nozzle 61, which is connected to the nozzle 61. The nozzle moving mechanism 69 moves the nozzle 61 between a position facing the main surface 91 of the substrate 9 and another position away from the substrate 9 in a horizontal direction.

Herein, the first cleaning solution is an alkaline or acid cleaning solution. One example of the alkaline first cleaning solution is SC1 (ammonia hydrogen peroxide mixture), dNH$_4$OH (diluted ammonium hydroxide), or the like. In the case of using the alkaline cleaning solution, in the later-described cleaning of the substrate 9, redeposition of particles onto the substrate 9 can be suppressed by a zeta potential and the particle removal efficiency is thereby increased. One example of the acid first cleaning solution is SC2 (hydrochloric acid/hydrogen peroxide mixture), hydrofluoric acid, or the like. In the case of using the acid cleaning solution, metal-based unnecessary substances can be efficiently removed. Typically, the first cleaning solution is an aqueous solution.

The second cleaning solution is an alkaline or acid cleaning solution, or a neutral cleaning solution. In a case where the first cleaning solution is alkaline, it is preferable that the second cleaning solution should be an alkaline or neutral cleaning solution. In a case where the first cleaning solution is acid, it is preferable that the second cleaning solution should be an acid or neutral cleaning solution. Like in the case of using the first cleaning solution, in the case of using the alkaline second cleaning solution, it is possible to increase the particle removal efficiency, and in the case of using the acid second cleaning solution, it is possible to efficiently remove metal-based unnecessary substances. The example of the alkaline second cleaning solution is the same as that of the alkaline first cleaning solution, and the example of the acid second cleaning solution is the same as that of the acid first cleaning solution. Typically, the alkaline or acid second cleaning solution is an aqueous solution, containing water. The neutral second cleaning solution is, for example, water (high-viscosity water with a thickener added thereto, as described later).

Preferably, the second cleaning solution is the same type of cleaning solution as the first cleaning solution. Specifically, the first cleaning solution and the second cleaning solution contain the same components, except the thickener described later. It is thereby possible to easily prepare the first cleaning solution and the second cleaning solution. In the case where the first cleaning solution and the second cleaning solution are the same type, the second cleaning solution is the alkaline or acid cleaning solution. As a matter of course, the first cleaning solution and the second cleaning solution may be different types of cleaning solutions.

The first cleaning solution contains the thickener and thereby has a viscosity higher than that of the first cleaning solution. A preferable thickener is a water-soluble polymer having a water-soluble polar group (hydroxyl group, ether group, amide group, or the like). An exemplary thickener is naturally-derived starch, gelatin, a cellulose derivative such as semisynthetic carboxymethyl cellulose (CMC), methyl cellulose (MC), or the like, or a synthetic water-soluble polymer such as polyvinyl alcohol (PVA), polyacrylic acid polymer, polyacrylamide (PAM), polyethylene oxide (PEO), polyvinylpyrrolidone (PVP), or the like. A thickener other than the water-soluble polymer may be used. As the concentration of the thickener in the second cleaning solution becomes higher, the viscosity of the second cleaning solution increases. The viscosity of the second cleaning solution is, for example, 500 mPa·s (millipascal second) or more, and preferably is 650 mPa·s or more. Since the second cleaning solution is required to have fluidity enough to be ejected from the nozzle 61, the viscosity of the second cleaning solution is a viscosity immediately before gelation of the second cleaning solution, or less. Preferably, the viscosity of the second cleaning solution is 10000 mPa·s or less.

As described earlier, the viscosity of the first cleaning solution is lower than that of the second cleaning solution and for example, the first cleaning solution contains no thickener or the concentration of the thickener contained in the first cleaning solution is lower than that in the second cleaning solution. The viscosity of the first cleaning solution containing no thickener is, for example, 10 mPa·s or less. The viscosity of the first cleaning solution containing a thickener is, for example, 100 mPa·s or less. A difference between the viscosity of the first cleaning solution and that of said second cleaning solution is 500 mPa·s or more, and preferably is 650 mPa·s or more. The rinse liquid does not contain any thickener, and the viscosity of the rinse liquid is, for example, 10 mPa·s or less. The viscosity of the rinse liquid is sufficiently lower than that of the second cleaning solution.

Next, a cleaning process of the substrate 9 in the substrate processing apparatus 1 will be described. The cleaning process described below is performed, for example, after a predetermined preprocessing is performed on the main surface 91 of the substrate 9. This preprocessing may be performed in the substrate processing apparatus 1 of FIG. 1 or may be performed in any other apparatus. One exemplary preprocessing performed in the substrate processing apparatus 1 is an etching process using an etching solution, or the like.

Figure 2:
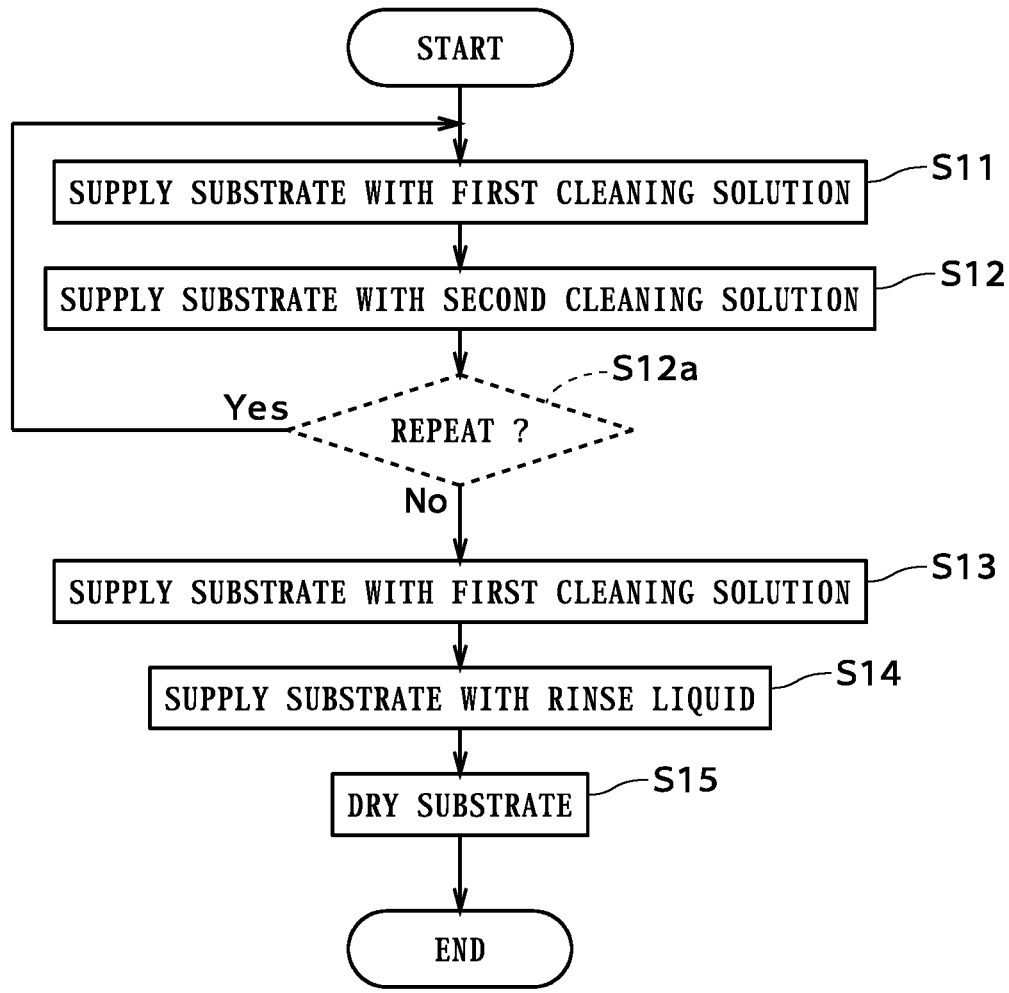
FIG. 2 is a flowchart showing an operation flow of a cleaning process of a substrate.
Figure 3:
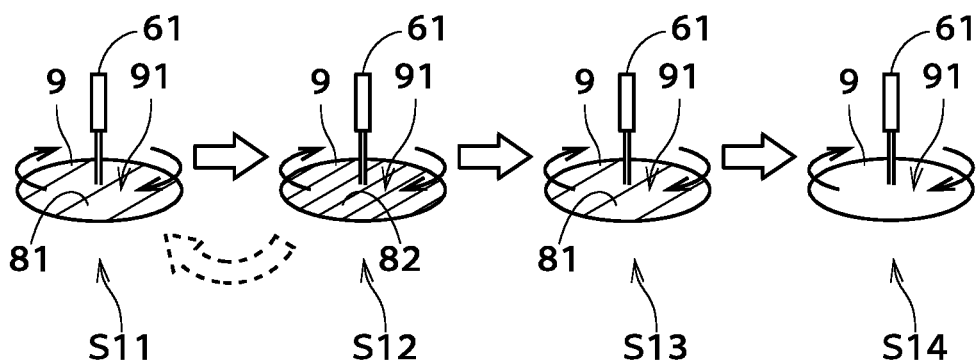
FIG. 3 is a view used for explaining the cleaning process.

FIG. 2 is a flowchart showing an operation flow of the cleaning process of the substrate 9, which is performed in the substrate processing apparatus 1. The process step (Step S12a) surrounded by a broken line in FIG. 2 is executed in another cleaning process described later. FIG. 3 is a view used for explaining the cleaning process, schematically showing the nozzle 61 and the substrate 9. In FIG. 3, respective states in the processings corresponding to Steps S11 to S14 of FIG. 2 are shown in this order from the left, and the same reference signs as used for the process steps, Steps S11 to S14, in the flowchart are given to these states, respectively (the same applies to FIGS. 7 to 13 described later).

In the cleaning process, first, the substrate 9 to be processed is transferred into the substrate processing apparatus 1 by an external transfer mechanism. In the substrate processing apparatus 1, the substrate 9 is held by the spin chuck 21 with the main surface 91 thereof facing upward. For example, on the main surface 91 of the substrate 9, a pattern is formed. Subsequently, the nozzle moving mechanism 69 disposes the nozzle 61 at a position facing the center of the main surface 91 of the substrate 9. Further, the spin motor 22 starts rotation of the substrate 9 at a predetermined number of rotations (rotation speed). Then, by opening the first cleaning solution valve 33, the first cleaning solution is continuously supplied onto the main surface 91 through the nozzle 61 (Step S11).

With the rotation of the substrate 9, the first cleaning solution is spread, and as shown in the leftmost view of FIG. 3, the main surface 91 is covered with the first cleaning solution 81. In other words, a liquid film of the first cleaning solution 81 is formed on the main surface 91. Herein, the first cleaning solution on the substrate 9 is referred to as a "first cleaning solution 81" (the same applies to a "second cleaning solution 82" described later). Further, the first cleaning solution spattering from the main surface 91 of the substrate 9 being rotated is received by the cup 23 and discharged (the same applies to the supply of the second cleaning solution and the supply of the rinse liquid described later). The supply of the first cleaning solution continues for a predetermined time, and after that, the first cleaning solution valve 33 is closed.

Figure 4:
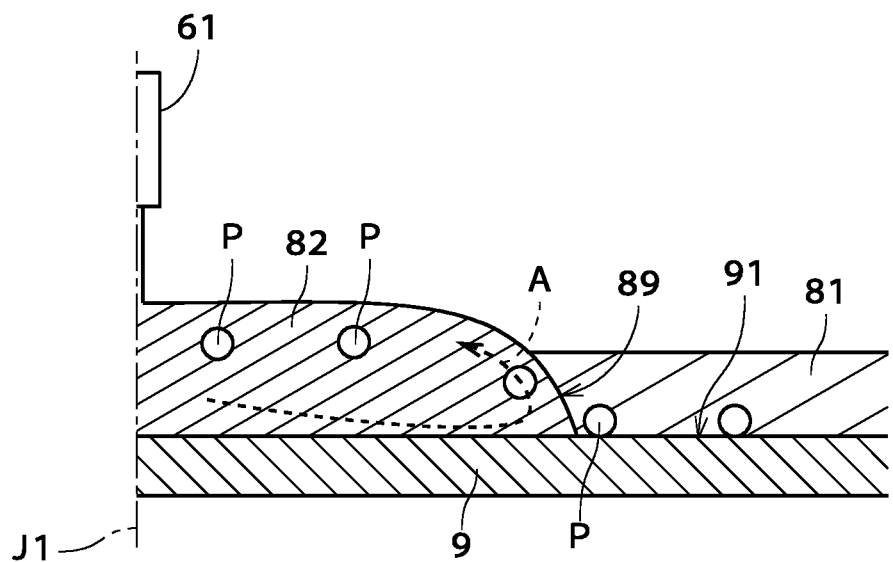
FIG. 4 is a view showing a first cleaning solution and a second cleaning solution on a substrate.

After the supply of the first cleaning solution is finished, by opening the second cleaning solution valve 43, the second cleaning solution is supplied onto the main surface 91 through the nozzle 61 (Step S12). When the supply of the second cleaning solution is started, there is a state where the liquid film of the first cleaning solution 81 is formed on the main surface 91. As shown in FIG. 4, the second cleaning solution 82 supplied onto the center of the main surface 91 is spread toward the outer edge of the substrate 9 with the rotation of the substrate 9 by the spin motor 22. On the main surface 91, the second cleaning solution 82 and the first cleaning solution 81 whose viscosities are largely different from each other are not immediately mixed with each other, and an interface (liquid-liquid interface) 89 between the second cleaning solution 82 and the first cleaning solution 81 is formed. Then, the interface 89 moves along the main surface 91 toward the outer edge of the substrate 9.

At that time, by a shear stress generated in the interface 89 between the second cleaning solution 82 and the first cleaning solution 81, a spiral flow occurs in the vicinity of the interface 89 of the second cleaning solution 82 on the main surface 91 (see the broken-line arrow A in FIG. 4), and unnecessary substances P such as particles or the like deposited on the main surface 91 are removed (peeled) from the main surface 91. The same occurs in the vicinity of the interface 89 of the first cleaning solution 81 on the main surface 91. Then, when the second cleaning solution 82 is spread up to the outer edge of the substrate 9, as shown in the second view from the left of FIG. 3, a liquid film of the second cleaning solution 82 is formed on the main surface 91. After the supply of the second cleaning solution continues for a predetermined time, the second cleaning solution valve 43 is closed.

After the supply of the second cleaning solution is finished, by opening the first cleaning solution valve 33, the first cleaning solution is supplied onto the main surface 91 through the nozzle 61 (Step S13). When the second supply of the first cleaning solution is started, there is a state where the liquid film of the second cleaning solution 82 is formed on the main surface 91. The first cleaning solution 81 supplied onto the center of the main surface 91 is spread toward the outer edge of the substrate 9 with the rotation of the substrate 9. An interface 89 between the first cleaning solution 81 and the second cleaning solution 82, which is formed on the main surface 91, thereby moves along the main surface 91 toward the outer edge of the substrate 9. Further, in the vicinity of the interface 89, a spiral flow occurs, and the unnecessary substances P deposited on the main surface 91 are removed from the main surface 91. Then, as shown in the third view from the left of FIG. 3, a liquid film of the first cleaning solution 81 is formed on the main surface 91. After the supply of the first cleaning solution continues for a predetermined time, the first cleaning solution valve 33 is closed.

After the supply of the first cleaning solution is finished, by opening the rinse liquid valve 53, the rinse liquid is supplied onto the main surface 91 through the nozzle 61 (Step S14). As shown in the rightmost view of FIG. 3, the first cleaning solution 81 is removed from the main surface 91. In other words, the first cleaning solution 81 is replaced with the rinse liquid. After the supply of the rinse liquid continues for a predetermined time, the rinse liquid valve 53 is closed. Further, there may be a case where Step S13 in which the first cleaning solution is supplied onto the main surface 91 is omitted and in Step S14, the second cleaning solution 82 is removed from the main surface 91 by the rinse liquid. From the viewpoint of appropriately removing the cleaning solution from the main surface 91 by using the rinse liquid, however, it is preferable that the rinse process should be performed in the state where the first cleaning solution having a viscosity lower than that of the second cleaning solution is deposited on the main surface 91.

Subsequently, by increasing the number of rotations of the substrate 9, drying of the substrate 9 is performed (Step S15). Further, concurrently with the drying of the substrate 9, the nozzle moving mechanism 69 moves the nozzle 61 to a position away from the substrate 9. After the drying of the substrate 9 continues for a predetermined time, the rotation of the spin chuck 21 is stopped. After that, the substrate 9 is taken out from the substrate processing apparatus 1 by the external transfer mechanism. The cleaning process of the substrate 9 in the substrate processing apparatus 1 is thereby completed.

Figure 5:
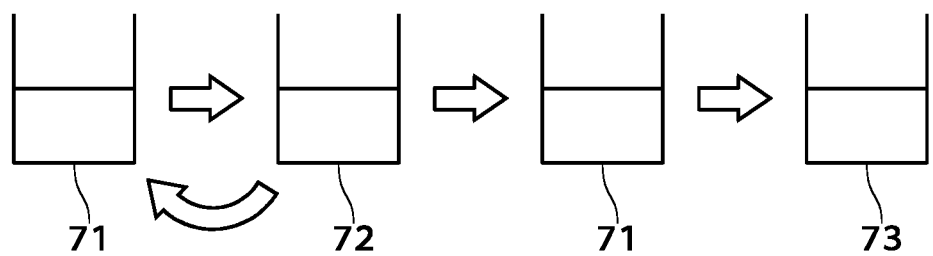
FIG. 5 is a view used for explaining an operation flow of an experimental example.

Herein, an experimental example using the first cleaning solution and the second cleaning solution will be described. FIG. 5 is a view used for explaining an operation flow of the experimental example. In the present experimental example, prepared are a container 71 for storing the first cleaning solution, a container 72 for storing the second cleaning solution, and a container 73 for storing the rinse liquid. The first cleaning solution is SC1 generated by mixing ammonia, hydrogen peroxide, and water at a ratio of 1:8:60. Further, the second cleaning solution is generated by mixing the above-described SC1 and polyvinylpyrrolidone (PVP) which is a thickener. The concentration of the PVP in the second cleaning solution is 50 wt %. The viscosity of the first cleaning solution which is SC1 containing no thickener is about 1 mPa·s, and the viscosity of the second cleaning solution which is SC1 containing PVP of 50 wt % is about 650 mPa·s. Specifically, the difference between the viscosity of the second cleaning solution and that of the first cleaning solution is about 650 mPa·s. The rinse liquid is pure water.

In the present experimental example, a plate-like sample having a main surface on which a pattern is formed and a plate-like sample having a main surface on which no pattern is formed are prepared, and particles of $SiO_2$ having a particle diameter of 78 nm are deposited onto these samples. Further, the number of particles deposited on the main surface of each sample is measured by a fine particle measuring instrument. Then, the cleaning process shown in FIG. 5 is performed. In the cleaning process of the present experimental example, first, each sample is immersed into the first cleaning solution in the container 71. Subsequently, the sample is taken out from the container 71, and then the sample, with the first cleaning solution deposited on its surface, is immersed into the second cleaning solution in the container 72. Further, the sample is taken out from the container 72, and then the sample, with the second cleaning solution deposited on its surface, is immersed into the first cleaning solution in the container 71. Thus, the immersion of the sample into the first cleaning solution in the container 71 and the immersion of the sample into the second cleaning solution in the container 72 are repeated predetermined times. After that, the sample is immersed into the first cleaning solution in the container 71, and subsequently the sample is immersed into the rinse liquid in the container 73. Then, by spraying nitrogen gas to the sample which is taken out from the container 73, the sample is dried.

After the above-described cleaning process, the number of particles deposited on the main surface of the sample is measured again. Herein, by dividing the difference between the number of particles before the cleaning process and the number of particles after the cleaning process by the number of particles before the cleaning process, a particle removal efficiency (PRE) is calculated. Further, as a comparative example, the cleaning solution in the container 72 is replaced with the SC1 containing no PVP, i.e., the first cleaning solution and the sample is cleaned by performing the same process as the above-described cleaning process.

Figure 6:
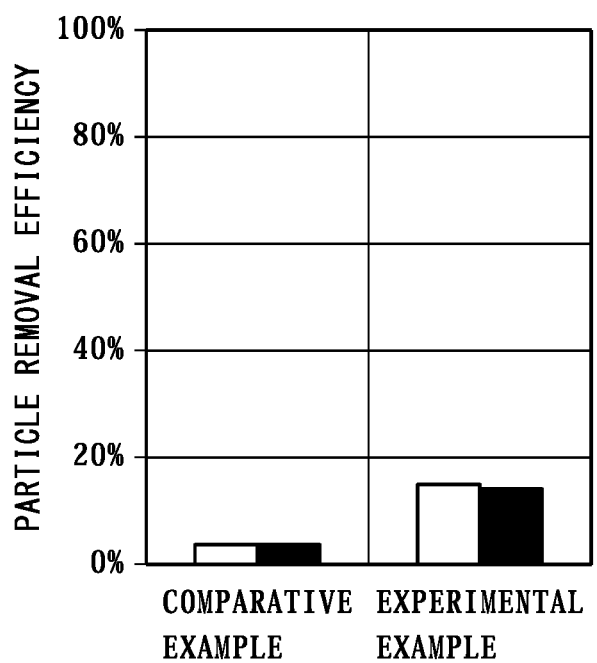
FIG. 6 is a graph showing respective particle removal efficiencies in the experimental example and a comparative example.

FIG. 6 is a graph showing respective particle removal efficiencies (PREs) in the experimental example and the comparative example. In FIG. 6, a white bar represents the PRE of the sample on which no pattern is formed and a black bar represents the PRE of the sample on which a pattern is formed. As shown in FIG. 6, in the experimental example in which the process for supplying the second cleaning solution to the sample with the first cleaning solution deposited thereon and the process for supplying the first cleaning solution to the sample with the second cleaning solution deposited thereon are repeated, the PRE increases as compared with the comparative example in which only the supply of the first cleaning solution to the sample is repeated. Further, in the experimental example, the difference between the viscosity of the first cleaning solution and that of the second cleaning solution is about 650 mPa·s and in this case, the PRE becomes three times or more as high as that in the comparative example. Therefore, in the case where the above-described difference in the viscosity is 650 mPa·s or more, for example, when the first cleaning solution contains no PVP and the concentration of the PVP in the second cleaning solution is 50 wt % or more (the viscosity of the second cleaning solution is about 650 mPa·s or more), it is considered that the PRE can be largely increased. From the above result, even in the case where the difference between the viscosity of the first cleaning solution and that of the second cleaning solution is about 500 mPa·s, it is considered that the PRE can be sufficiently increased as compared with the comparative example.

As described above, the substrate processing apparatus 1 of FIG. 1 includes the first cleaning solution supply part 3 for supplying the main surface 91 of the substrate 9 with the alkaline or acid first cleaning solution and the second cleaning solution supply part 4 for supplying the main surface 91 with the second cleaning solution containing the thickener and having a viscosity higher than that of the first cleaning solution. Then, in a state where one cleaning solution out of the first cleaning solution and the second cleaning solution is present on the main surface 91, the other cleaning solution is supplied onto the main surface 91. It is thereby possible to more reliably remove unnecessary substances on the main surface 91 of the substrate 9.

In the substrate processing apparatus 1, the interface 89 between the first cleaning solution and the second cleaning solution, which is formed on the main surface 91, moves along the main surface 91 with the rotation of the substrate 9. It is thereby possible to easily move the interface 89 and more reliably remove unnecessary substances over a wide range of the main surface 91 of the substrate 9. Further, by the control of the control part 10 over the first cleaning solution supply part 3 and the second cleaning solution supply part 4, the second cleaning solution is supplied onto the main surface 91 in the state where the liquid film of the first cleaning solution is formed on the main surface 91. Subsequently, in the state where the liquid film of the second cleaning solution is formed on the main surface 91, the first cleaning solution is supplied onto the main surface 91. As a result, it is possible to effectively remove unnecessary substances on the main surface 91 of the substrate 9.

In the substrate processing apparatus 1, like in the above-described experimental example, the supply of the first cleaning solution and the supply of the second cleaning solution may be repeated on the main surface 91. In this case, a process step surrounded by the broken line in FIG. 2 (Step S12*a*) is executed. Specifically, after the second cleaning solution is supplied onto the main surface 91 (Step S12), in the control part 10, it is checked if the number of repetitions of the supply of the first cleaning solution onto the main surface 91 and the supply of the second cleaning solution onto the main surface 91 reaches a predetermined set number of times. When the number of repetitions does not reach the set number of times (Step S12*a*), the supply of the first cleaning solution onto the main surface 91 (Step S11) and the supply of the second cleaning solution onto the main surface 91 (Step S12) are repeated (see the broken-line arrow in FIG. 3).

At that time, in the state where the liquid film of one cleaning solution out of the first cleaning solution and the second cleaning solution is formed on the main surface 91, the other cleaning solution is supplied onto the main surface 91. It is thereby possible to remove the one cleaning solution and form the liquid film of the other cleaning solution while removing unnecessary substances from the main surface 91. Subsequently, the one cleaning solution is supplied onto the main surface 91 in the state where the liquid film of the other cleaning solution is formed on the main surface 91. It is thereby possible to remove the other cleaning solution and form the liquid film of the one cleaning solution while removing unnecessary substances from the main surface 91.

When the number of repetitions reaches the set number of times (Step S12*a*), the process goes to Step S13 and the final supply of the first cleaning solution is performed onto the main surface 91. After that, the supply of the rinse liquid onto the main surface 91 (Step S14) and the drying of the substrate 9 (Step S15) are performed, and the cleaning process of the substrate 9 is thereby completed. In the substrate processing apparatus 1 in which the supply of the first cleaning solution and the supply of the second cleaning solution are repeated for the main surface 91, it is possible to more effectively remove unnecessary substances on the main surface 91 of the substrate 9.

Figure 7:
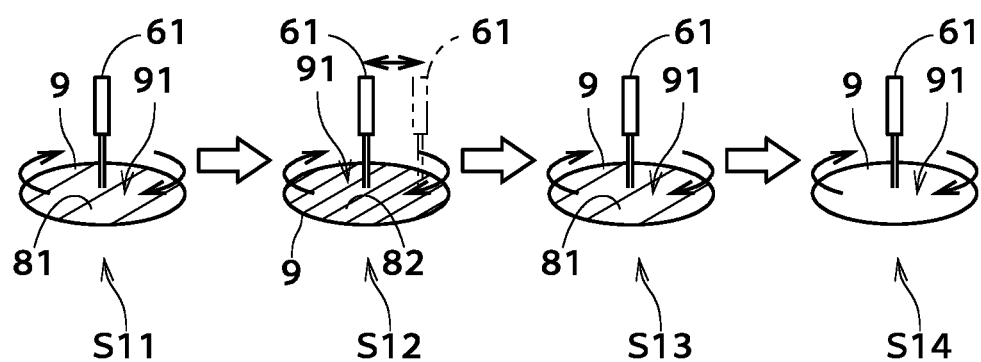
FIG. 7 is a view used for explaining another exemplary cleaning process.

In Step S12, when the second cleaning solution is supplied onto the main surface 91 of the substrate 9, as shown in the second view from the left of FIG. 7, the nozzle moving mechanism 69 may oscillate the nozzle 61 along the main surface 91. For example, above the substrate 9 being rotated, the nozzle 61 reciprocates in the horizontal direction between the position facing the center of the main surface 91 and a position facing the outer edge portion of the main surface 91. In the exemplary case shown in FIG. 7, not only with the rotation of the substrate 9 but also with the move (scan) of the nozzle 61, the interface 89 between the first cleaning solution and the second cleaning solution on the main surface 91 moves along the main surface 91.

Figure 8:
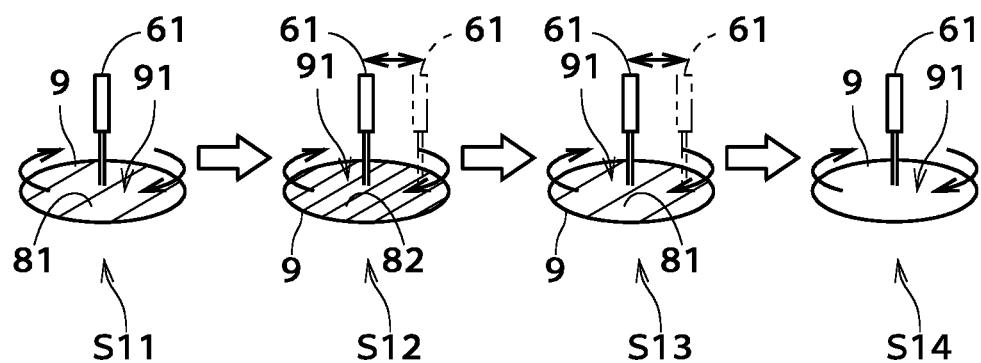
FIG. 8 is a view used for explaining another exemplary cleaning process.
Figure 9:
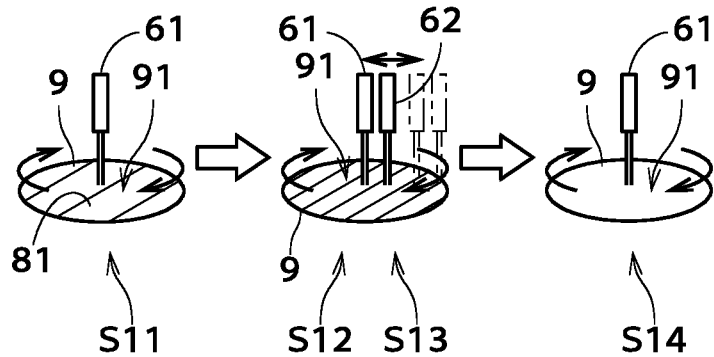
FIG. 9 is a view used for explaining another exemplary cleaning process.
Figure 10:
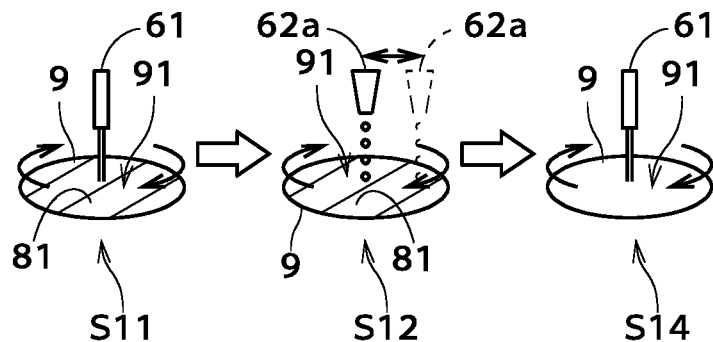
FIG. 10 is a view used for explaining another exemplary cleaning process.

In Step S13, when the first cleaning solution is supplied onto the main surface 91 of the substrate 9, as shown in the third view from the left of FIG. 8, the nozzle moving mechanism 69 may oscillate the nozzle 61 along the main surface 91. Further, like in the case of FIG. 7, also when the second cleaning solution is supplied onto the main surface 91 of the substrate 9, the nozzle 61 is oscillated (see the second view from the left of FIG. 8). Thus, in the exemplary case shown in FIG. 8, not only with the rotation of the substrate 9 but also with the move of the nozzle 61, both the change of first cleaning solution covering the main surface 91 to the second cleaning solution and the change of second cleaning solution covering the main surface 91 to the first cleaning solution are performed.

In the substrate processing apparatus 1, a nozzle of the first cleaning solution supply part 3 and a nozzle of the second cleaning solution supply part 4 may be individually provided (the same applies to a nozzle of the rinse liquid supply part 5). In the exemplary case shown in FIG. 9, in Step S11, the first cleaning solution is supplied onto the main surface 91 of the substrate 9 through the nozzle 61 of the first cleaning solution supply part 3 (see the leftmost view in FIG. 9). Subsequently, Steps S12 and S13 are performed concurrently (see the second view from the left of FIG. 9). In other words, the supply of the second cleaning solution from the nozzle 62 of the second cleaning solution supply part 4 onto the main surface 91 and the supply of the first cleaning solution from the nozzle 61 of the first cleaning solution supply part 3 onto the main surface 91 are performed at the same time. Further, an oscillation of the two nozzles 61 and 62 is performed. In the exemplary case shown in FIG. 9, it is possible to continuously generate the interface 89 between the first cleaning solution and the second cleaning solution on the main surface 91 and move the interface 89 over a wide range. As a result, it is possible to appropriately remove unnecessary substances on the main surface 91 of the substrate 9.

In the second cleaning solution supply part 4, a two-fluid nozzle for ejecting droplets of the second cleaning solution may be provided. In the exemplary case shown in FIG. 10, in Step S12, in the state where the liquid film of the first cleaning solution 81 is formed on the main surface 91, the droplets of the second cleaning solution are ejected from the two-fluid nozzle 62*a* of the second cleaning solution supply part 4 and the second cleaning solution is thereby supplied onto the main surface 91 of the substrate 9 (see the second view from the left of FIG. 10). The two-fluid nozzle 62a reciprocates in the horizontal direction between the position facing the center of the main surface 91 and the position facing the outer edge portion of the main surface 91. By using the two-fluid nozzle 62a, it is possible to effectively remove unnecessary substances on the main surface 91 of the substrate 9 by using a physical effect. Further, it is possible to increase a surface area of the interface 89 between the first cleaning solution and the second cleaning solution and thereby increase the removal efficiency of unnecessary substances. Furthermore, in the exemplary case shown in FIG. 10, Step S13 in which the first cleaning solution is supplied onto the substrate 9 immediately before the supply of the rinse liquid onto the substrate 9 is omitted (the same applies to FIGS. 11 and 13 described later).

Figure 11:
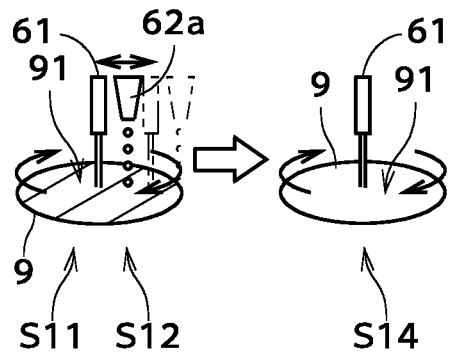
FIG. 11 is a view used for explaining another exemplary cleaning process.

Further, in the case of using the two-fluid nozzle 62a, as shown in the leftmost view of FIG. 11, Steps S11 and S12 may be performed concurrently. Specifically, the supply of the first cleaning solution from the nozzle 61 of the first cleaning solution supply part 3 onto the main surface 91 and the supply of the droplets of the second cleaning solution from the two-fluid nozzle 62a of the second cleaning solution supply part 4 onto the main surface 91 are performed at the same time. The two nozzles 61 and 62a are oscillated along the main surface 91 by the nozzle moving mechanism 69.

In the first cleaning solution supply part 3, a two-fluid nozzle for ejecting droplets of the first cleaning solution may be provided. In this case, for example, in Step S13, in the state where the liquid film of the second cleaning solution is formed on the main surface 91, the droplets of the first cleaning solution are ejected from the two-fluid nozzle of the first cleaning solution supply part 3, to thereby remove unnecessary substances on the main surface 91. Further, the supply of the droplets of the first cleaning solution from the two-fluid nozzle of the first cleaning solution supply part 3 onto the main surface 91 and the supply of the second cleaning solution from the nozzle 61 of the second cleaning solution supply part 4 onto the main surface 91 may be performed at the same time (see the leftmost view of FIG. 11). In the substrate processing apparatus 1, by providing the two-fluid nozzle in the first cleaning solution supply part 3 or the second cleaning solution supply part 4, it becomes possible to effectively remove unnecessary substances on the main surface 91.

Figure 12:
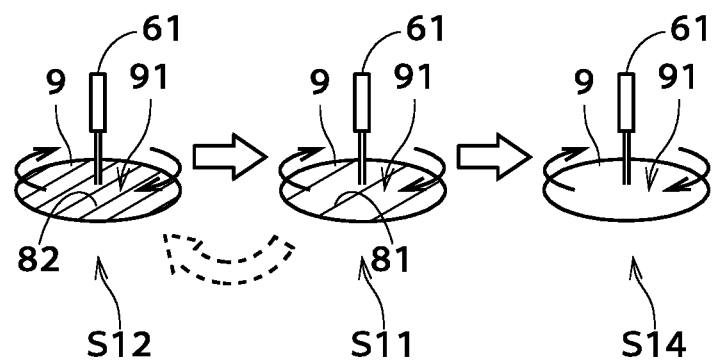
FIG. 12 is a view used for explaining another exemplary cleaning process.
Figure 13:
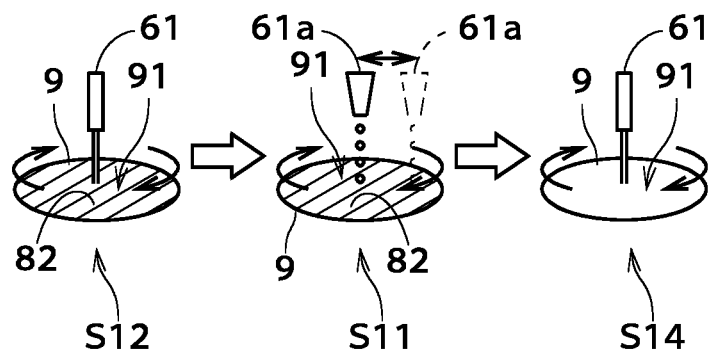
FIG. 13 is a view used for explaining another exemplary cleaning process.

As shown in FIG. 12, in the substrate processing apparatus 1, the supply of the second cleaning solution onto the substrate 9 in Step S12 may be performed prior to the supply of the first cleaning solution onto the substrate 9 in Step S11. In this case, depending on the type of unnecessary substances on the main surface 91 of the substrate 9, since the high-viscosity second cleaning solution wraps the unnecessary substances, when the first cleaning solution is supplied, sometimes the unnecessary substances are efficiently removed. On the other hand, as described above, in the case where the supply of the first cleaning solution onto the substrate 9 is performed prior to the supply of the second cleaning solution onto the substrate 9, since the high-viscosity second cleaning solution is supplied onto the main surface 91 covered with the first cleaning solution, the second cleaning solution is more easily spread on the main surface 91. In the exemplary case shown in FIG. 12, the supply of the second cleaning solution and the supply of the first cleaning solution may be repeated on the main surface 91 (see the broken-line arrow in FIG. 12). Further, as shown in the second view from the left of FIG. 13, for the supply of the first cleaning solution onto the substrate 9, the two-fluid nozzle 61a for ejecting the droplets of the first cleaning solution may be used.

Figure 14:
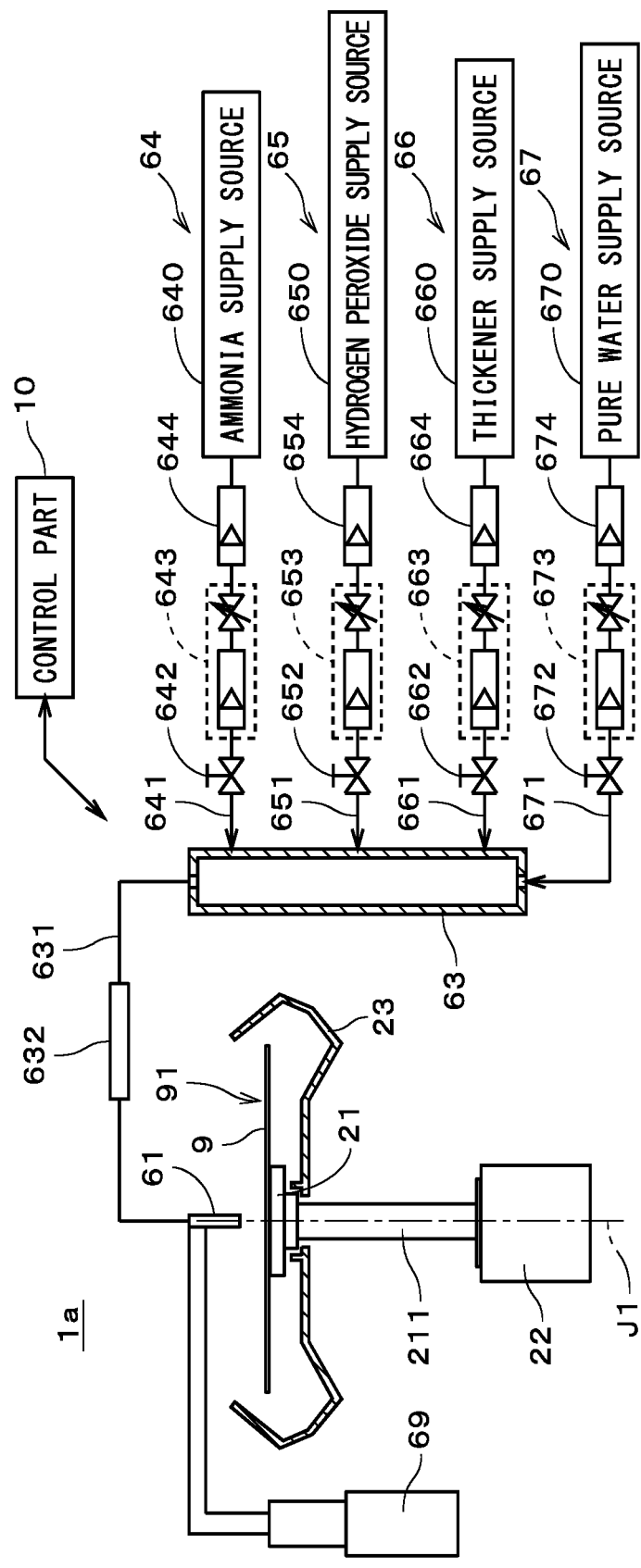
FIG. 14 is a view showing a configuration of a substrate processing apparatus in accordance with a second preferred embodiment.

FIG. 14 is a view showing a configuration of a substrate processing apparatus 1a in accordance with the second preferred embodiment of the present invention. In the substrate processing apparatus 1a of FIG. 14, respective constitutions of the first cleaning solution supply part 3, the second cleaning solution supply part 4, and the rinse liquid supply part 5 are different from those of the substrate processing apparatus 1 shown in FIG. 1. The constituent elements other than the above are identical to those of FIG. 1, and the same constituent elements are represented by the same reference signs.

The substrate processing apparatus 1a includes the nozzle 61, a mixing part 63, a nozzle supply pipe 631, an ammonia introduction part 64, a hydrogen peroxide introduction part 65, a thickener introduction part 66, and a pure water introduction part 67. The nozzle supply pipe 631 connects the nozzle 61 to the mixing part 63. An agitator flow pipe 632 is provided on the nozzle supply pipe 631. The mixing part 63 has an internal space which is long in one direction.

The ammonia introduction part 64 includes an ammonia introduction pipe 641 and an ammonia supply source 640. One end of the ammonia introduction pipe 641 is connected to the mixing part 63 and the other end thereof is connected to the ammonia supply source 640. Aqueous ammonia is supplied from the ammonia supply source 640 to the ammonia introduction pipe 641. The hydrogen peroxide introduction part 65 includes a hydrogen peroxide introduction pipe 651 and a hydrogen peroxide supply source 650. One end of the hydrogen peroxide introduction pipe 651 is connected to the mixing part 63 and the other end thereof is connected to the hydrogen peroxide supply source 650. Hydrogen peroxide water is supplied from the hydrogen peroxide supply source 650 to the hydrogen peroxide introduction pipe 651.

The thickener introduction part 66 includes a thickener introduction pipe 661 and a thickener supply source 660. One end of the thickener introduction pipe 661 is connected to the mixing part 63 and the other end thereof is connected to the thickener supply source 660. An aqueous solution of the thickener is supplied from the thickener supply source 660 to the thickener introduction pipe 661. The pure water introduction part 67 includes a pure water introduction pipe 671 and a pure water supply source 670. One end of the pure water introduction pipe 671 is connected to the mixing part 63 and the other end thereof is connected to the pure water supply source 670. Pure water is supplied from the pure water supply source 670 to the pure water introduction pipe 671.

In the ammonia introduction pipe 641, the hydrogen peroxide introduction pipe 651, the thickener introduction pipe 661, and the pure water introduction pipe 671, in this order from one-end side (the mixing part 63 side) to the other-end side, provided are open/close valves 642, 652, 662, and 672, control valves 643, 653, 663, and 673, and flowmeters 644, 654, 664, and 674, respectively. The open/close valves 642, 652, 662, and 672 open/close the introduction pipes 641, 651, 661, and 671. The control valves 643, 653, 663, and 673 have respective flowmeters and flow regulating valves, to thereby adjust respective flow rates of liquids flowing in the introduction pipes 641, 651, 661, and 671. The flowmeters 644, 654, 664, and 674 measure the respective flow rates of liquids flowing in the introduction pipes 641, 651, 661, and 671.

In the cleaning process in the substrate processing apparatus 1a, the respective open/close valves 642, 652, and 672 of the ammonia introduction pipe 641, the hydrogen peroxide introduction pipe 651, and the pure water introduction pipe 671 are opened and the open/close valve 662 of the thickener introduction pipe 661 is closed. The aqueous ammonia from the ammonia introduction pipe 641, the hydrogen peroxide water from the hydrogen peroxide introduction pipe 651, and the pure water from the pure water introduction pipe 671 are thereby supplied into the mixing part 63. At that time, since the respective flow rates of the aqueous ammonia, the hydrogen peroxide water, and the pure water are adjusted by the control valves 643, 653, and 673, the SC1 which is adjusted to have a predetermined mixing ratio is generated in the mixing part 63. The aqueous ammonia, the hydrogen peroxide water, and the pure water are carried toward the nozzle 61 through the nozzle supply pipe 631. In the nozzle supply pipe 631, the aqueous ammonia, the hydrogen peroxide water, and the pure water are sufficiently agitated by the agitator flow pipe 632 and supplied as the first cleaning solution onto the main surface 91 of the substrate 9 through the nozzle 61 (FIG. 2: Step S11).

After the supply of the first cleaning solution continues for a predetermined time, in the state where the respective open/close valves 642, 652, and 672 of the ammonia introduction pipe 641, the hydrogen peroxide introduction pipe 651, and the pure water introduction pipe 671 are still opened, the open/close valve 662 of the thickener introduction pipe 661 is opened. The thickener aqueous solution is thereby supplied to the mixing part 63, additionally to the aqueous ammonia, the hydrogen peroxide water, and the pure water. Further, the respective flow rates of the aqueous ammonia, the hydrogen peroxide water, the thickener aqueous solution, and the pure water are adjusted by the control valves 643, 653, 663, and 673. The SC1 which is adjusted to have a predetermined mixing ratio and a predetermined viscosity is thereby supplied as the second cleaning solution onto the main surface 91 of the substrate 9 through the nozzle 61 (Step S12). As necessary, the supply of the first cleaning solution and the supply of the second cleaning solution are repeated on the main surface 91 (Step S12a).

After that, by the same operation as that in Step S11, the first cleaning solution is supplied onto the substrate 9 (Step S13). After the supply of the first cleaning solution continues for a predetermined time, in a state where the open/close valve 672 of the pure water introduction pipe 671 is still opened, the respective open/close valves 642, 652, and 662 of the ammonia introduction pipe 641, the hydrogen peroxide introduction pipe 651, and the thickener introduction pipe 661 are closed. The pure water is thereby supplied as the rinse liquid onto the main surface 91 of the substrate 9 through the nozzle 61 (Step S14). After the supply of the rinse liquid continues for a predetermined time, by closing the open/close valve 672 of the pure water introduction pipe 671, the supply of the rinse liquid onto the main surface 91 is stopped. After that, by increasing the number of rotations of the substrate 9, the drying of the substrate 9 is performed (Step S15). When the drying of the substrate 9 is completed, the rotation of the substrate 9 is stopped, and the cleaning process of the substrate 9 in the substrate processing apparatus 1a is thereby completed.

In the substrate processing apparatus 1a of FIG. 14, the first cleaning solution supply part for supplying the first cleaning solution onto the main surface 91 of the substrate 9 is implemented by the nozzle 61, the mixing part 63, the ammonia introduction part 64, the hydrogen peroxide introduction part 65, and the pure water introduction part 67. Further, the second cleaning solution supply part for supplying the second cleaning solution onto the main surface 91 of the substrate 9 is implemented by the nozzle 61, the mixing part 63, the ammonia introduction part 64, the hydrogen peroxide introduction part 65, the thickener introduction part 66, and the pure water introduction part 67. Also in the substrate processing apparatus 1a, in the state where one cleaning solution out of the first cleaning solution and the second cleaning solution is present on the main surface 91, the other cleaning solution is supplied onto the main surface 91. It is thereby possible to more reliably remove unnecessary substances on the main surface 91 of the substrate 9. Further, the rinse liquid supply part for supplying the rinse liquid onto the main surface 91 after the first cleaning solution and the second cleaning solution are supplied onto the main surface 91 is implemented by the nozzle 61, the mixing part 63, and the pure water introduction part 67.

Also in the substrate processing apparatus 1a, like in the substrate processing apparatus 1, any one of various first cleaning solutions and any one of various second cleaning solutions may be used, and in accordance with the types of the first cleaning solution and the second cleaning solution, respective introduction parts for necessary liquid components are provided. Further, the first cleaning solution and the second cleaning solution may be different types of cleaning solutions. For example, when the first cleaning solution is the SC1, the second cleaning solution may be high-viscosity water (the same applies to the substrate processing apparatus 1 of FIG. 1). In this case, in Step S12, by opening only the respective open/close valves 662 and 672 of the thickener introduction pipe 661 and the pure water introduction pipe 671, the high-viscosity water is supplied onto the main surface 91 through the nozzle 61.

In the above-described substrate processing apparatuses 1 and 1a, various modifications can be made.

In the substrate processing apparatus, there may be a case where a first cleaning solution bath for storing therein the first cleaning solution and a second cleaning solution bath for storing therein the second cleaning solution are provided and the same process as the cleaning process of the experimental example shown in FIG. 5 is performed. In this case, the first cleaning solution bath is regarded as the first cleaning solution supply part, and by immersing the substrate 9 into the first cleaning solution in the first cleaning solution bath, the first cleaning solution is supplied onto the main surface 91. Similarly, the second cleaning solution bath is regarded as the second cleaning solution supply part, and by immersing the substrate 9 into the second cleaning solution in the second cleaning solution bath, the second cleaning solution is supplied onto the main surface 91. Further, a rinse liquid bath for storing therein the rinse liquid may be provided as the rinse liquid supply part.

In the substrate processing apparatuses 1 and 1a, a third cleaning solution having a viscosity higher than that of the first cleaning solution and lower than that of the second cleaning solution may be used. When the high-viscosity second cleaning solution is supplied onto the substrate 9 prior to the supply of the low-viscosity first cleaning solution onto the substrate 9, for example, in a case where the second cleaning solution is hard to spread on the main surface 91 or the second cleaning solution is hard to penetrate into spaces (very small gaps) among elements in the pattern on the main surface 91, the middle-viscosity third cleaning solution is supplied onto the main surface 91, prior to the supply of the second cleaning solution. It thereby becomes possible to appropriately spread the second cleaning solution on the main surface 91 or appropriately penetrate the second cleaning solution into the gaps among the elements in the pattern.

The substrate to be processed in the substrate processing apparatuses 1 and 1a is not limited to a semiconductor substrate, but a glass substrate or any other substrate may be used.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST 1, 1a Substrate processing apparatus
3 First cleaning solution supply part
4 Second cleaning solution supply part
5 Rinse liquid supply part
9 Substrate
10 Control part
21 Spin chuck
22 Spin motor
61, 62 Nozzle
61a, 62a Two-fluid nozzle
63 Mixing part
64 Ammonia introduction part
65 Hydrogen peroxide introduction part
66 Thickener introduction part
67 Pure water introduction part
81 First cleaning solution
82 Second cleaning solution
89 Interface (between first cleaning solution and second cleaning solution)
91 Main surface
J1 Central axis
S11 to S15, S12a Step

The invention claimed is:

1. A substrate processing method, comprising:
a) supplying a main surface of a substrate with an alkaline or acid first cleaning solution; and
b) supplying said main surface with a second cleaning solution containing a thickener and having a viscosity higher than that of said first cleaning solution in a state where said first cleaning solution is present on said main surface, wherein
said substrate held in a horizontal position is rotated around an axis perpendicular to said main surface as a center and with the rotation of said substrate, an interface between said first cleaning solution and said second cleaning solution, which is formed on said main surface, moves along said main surface in said operation b).

2. The substrate processing method according to claim 1, further comprising:
supplying said main surface with a rinse liquid after supplying said main surface with said first cleaning solution and said second cleaning solution.

3. A substrate processing method performed with a first cleaning solution, a second cleaning solution, and a thickener, wherein a liquid component of said first cleaning solution, a liquid component of said second cleaning solution, and said thickener are supplied to a mixing part via respective introduction parts, the method comprising:

a) supplying a main surface of a substrate with one cleaning solution from said mixing part, said one cleaning solution being one selected from said first cleaning solution and said second cleaning solution, said first cleaning solution being an alkaline or acid solution, said second cleaning solution containing the thickener and having a viscosity higher than that of said first cleaning solution, said one cleaning solution being ejected from a nozzle; and
b) supplying said main surface with another cleaning solution from said mixing part in a state where said one cleaning solution is present on said main surface, said another cleaning solution being one which is not selected as said one cleaning solution from said first cleaning solution and said second cleaning solution, said another cleaning solution being ejected from said nozzle; and
c) while said substrate is held in a horizontal position, rotating said substrate around an axis perpendicular to said main surface as a center to move an interface that is formed between said one cleaning solution and said another cleaning solution along said main surface while performing step b), wherein
said one cleaning solution and said another cleaning solution are generated by adjusting a flow rate of said thickener flowing into said mixing part while performing steps a) and b).

4. The substrate processing method according to claim 1, wherein
in a state where a liquid film of said first cleaning solution is formed on said main surface, said second cleaning solution is supplied onto said main surface in said operation b).

5. The substrate processing method according to claim 4, wherein
by supplying said main surface with said second cleaning solution, said first cleaning solution is removed from said main surface and a liquid film of said second cleaning solution is formed thereon in said operation b),
said substrate processing method further comprising:
supplying said main surface with said first cleaning solution in a state where the liquid film of said second cleaning solution is formed on said main surface.

6. The substrate processing method according to claim 1, wherein
said first cleaning solution or said second cleaning solution is ejected as droplets from a two-fluid nozzle.

7. The substrate processing method according to claim 1, wherein
said first cleaning solution and said second cleaning solution are the same type of cleaning solution.

8. The substrate processing method according to claim 1, wherein
a concentration of a thickener contained in said first cleaning solution is lower than that in said second cleaning solution, or said first cleaning solution contains no thickener.

9. The substrate processing method according to claim 1, wherein
said second cleaning solution contains water, and
said thickener in said second cleaning solution is a water-soluble polymer.

10. The substrate processing method according to claim 1, wherein a difference between the viscosity of said first cleaning solution and that of said second cleaning solution is 500 mPa·s or more.

11. The substrate processing method according to claim 1, wherein
in a state where a liquid film of said first cleaning solution is formed on said main surface, said first cleaning solution and said second cleaning solution are supplied onto said main surface at the same time in said operation b).

12. The substrate processing method according to claim 3, wherein
said one cleaning solution is said first cleaning solution, and said another cleaning solution is said second cleaning solution.

13. A substrate processing method with a first cleaning solution, a second cleaning solution, and a third cleaning solution, the second cleaning solution having a viscosity higher than viscosities of the first and the third cleaning solutions, and the third cleaning solution having a viscosity higher than the viscosity of the first cleaning solution, the method comprising:
a) supplying a main surface of a substrate with the third cleaning solution;
b) supplying the main surface of the substrate with the second cleaning solution, said second cleaning solution containing a thickener; and
c) supplying said main surface with said first cleaning solution in a state where said second cleaning solution is present on said main surface, said first cleaning solution being an alkaline or acid solution; and
d) while said substrate is held in a horizontal position, rotating said substrate around an axis perpendicular to said main surface as a center to move an interface that is formed between said first cleaning solution and said second cleaning solution along said main surface while performing step c).

\* \* \* \* \*